United States Patent
Koo et al.

(10) Patent No.: US 9,783,884 B2
(45) Date of Patent: *Oct. 10, 2017

(54) METHOD FOR IMPLEMENTING LOW DOSE IMPLANT IN A PLASMA SYSTEM

(71) Applicant: Varian Semiconductor Equipment Associates, Inc., Gloucester, MA (US)

(72) Inventors: Ilwoong Koo, North Andover, MA (US); Jun Lee, Andover, MA (US); Aseem K. Srivastava, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 553 days.

This patent is subject to a terminal disclaimer.

(21) Appl. No.: 14/193,758

(22) Filed: Feb. 28, 2014

(65) Prior Publication Data
US 2014/0272182 A1    Sep. 18, 2014

Related U.S. Application Data

(60) Provisional application No. 61/783,789, filed on Mar. 14, 2013.

(51) Int. Cl.
*C23C 14/48*   (2006.01)
*C23C 14/54*   (2006.01)
*H01J 37/32*   (2006.01)

(52) U.S. Cl.
CPC .............. *C23C 14/54* (2013.01); *C23C 14/48* (2013.01); *H01J 37/3211* (2013.01);
(Continued)

(58) Field of Classification Search
CPC ....... C23C 14/48; C23C 14/54; C23C 16/515; H01J 37/3211; H01J 37/32119;
(Continued)

(56) References Cited

U.S. PATENT DOCUMENTS 5,289,010 A  * 2/1994 Shohet .................. H01J 27/18
                                                        250/398
6,305,316 B1 * 10/2001 DiVergilio ........ H01J 37/32082
                                                        118/723 AN
(Continued)

FOREIGN PATENT DOCUMENTS

KR   10-2011-0134178 A    12/2011

OTHER PUBLICATIONS

International Search Report and Written Opinion mailed Jul. 25, 2014 for PCT/US2014/024017 filed Mar. 12, 2014.

*Primary Examiner* — Marianne L Padgett

(57) ABSTRACT

Methods of decreasing the dose per pulse implanted into a workpiece disposed in a process chamber are disclosed. According to one embodiment, the plasma is generated by a RF power supply. This RF power supply may have two different modes, a first, referred to as continuous wave mode, where the RF power supply is continuously outputting a voltage. This mode allows creation of the plasma within the process chamber. During the second mode, referred to as pulsed plasma mode, the RF power supply outputs two different power levels. The platen bias voltage may be a more negative value when the lower RF power level is being applied. This pulsed (or multi-setpoint) plasma also assists in reducing dopant deposition on the wafer during the time when CW plasma is on but the bias voltage pulse is in the off-state. In a further embodiment, a delay is introduced between the transition to the pulsed plasma mode and the initiation of the implanting process. In yet another embodiment the plasma is generated at a location in the chamber more judicious to reducing the dose impinging on the wafer, thereby increasing the process time to allow adequate control of the process.

16 Claims, 7 Drawing Sheets

(52) U.S. Cl.
CPC .. *H01J 37/32128* (2013.01); *H01J 37/32146* (2013.01); *H01J 37/32412* (2013.01); *H01J 37/32422* (2013.01); *H01J 2237/3365* (2013.01)

(58) Field of Classification Search
CPC ........... H01J 37/32128; H01J 37/32146; H01J 37/32174; H01J 37/32183; H01J 37/32412; H01J 37/32422; H01J 2237/3365
USPC ....... 438/369, 423, 440, 450, 473, 480, 514, 438/766, 798; 427/523–531
See application file for complete search history.

(56) References Cited

U.S. PATENT DOCUMENTS

| | | | | |
|---|---|---|---|---|
| 6,338,313 | B1* | 1/2002 | Chan | H01J 37/20 118/718 |
| 6,464,891 | B1* | 10/2002 | Druz | C23C 14/0605 134/1 |
| 8,664,561 | B2* | 3/2014 | Hadidi | C23C 14/48 118/723 FI |
| 9,123,509 | B2 | 9/2015 | Papasouliotis | H01J 37/32146 |
| 2001/0046566 | A1* | 11/2001 | Chu | C23C 8/36 427/523 |
| 2002/0139658 | A1 | 10/2002 | Kanakasabapathy et al. | |
| 2008/0075880 | A1* | 3/2008 | Renau | H01L 21/2236 427/523 |
| 2008/0230008 | A1 | 9/2008 | Paterson et al. | |
| 2008/0315127 | A1* | 12/2008 | Torregrosa | C23C 8/36 250/492.3 |
| 2009/0078678 | A1 | 3/2009 | Kojima et al. | |
| 2009/0104719 | A1* | 4/2009 | Gupta | H01L 22/20 438/7 |
| 2009/0104761 | A1* | 4/2009 | Jeon | H01J 37/32412 438/513 |
| 2009/0200461 | A1* | 8/2009 | Raj | C23C 14/48 250/287 |
| 2010/0024841 | A1* | 2/2010 | Koo | H01J 27/02 134/1.1 |
| 2011/0000896 | A1* | 1/2011 | Hadidi | C23C 14/48 219/121.59 |
| 2011/0230038 | A1* | 9/2011 | Hayashi | H01L 21/2236 438/513 |
| 2011/0309049 | A1* | 12/2011 | Papasouliotis | H01J 37/32146 216/37 |
| 2012/0000421 | A1 | 1/2012 | Miller et al. | |
| 2013/0164453 | A1* | 6/2013 | Pitcher | H01J 27/024 427/523 |
| 2014/0127394 | A1* | 5/2014 | Gammel | H01J 27/08 427/8 |

* cited by examiner

METHOD FOR IMPLEMENTING LOW DOSE IMPLANT IN A PLASMA SYSTEM

This application claims priority of U.S. Provisional Patent Application Ser. No. 61/783,789, filed Mar. 14, 2013, the disclosure of which is incorporated by reference in its entirety.

FIELD

The present disclosure relates to methods for reducing the ion dose implanted into a workpiece in a PLAD system.

BACKGROUND

Semiconductor workpieces are processed within process chambers. One such chamber is known as a plasma deposition chamber, which is part of a PLAD system. In operation, one or more dopant gasses are fed into the process chamber. These gasses are energized into a plasma through the use of radio frequency (RF) or other forms of energy, such as by utilizing one or more RF antennas or coils. A workpiece is disposed on a platen within the process chamber. This platen may be in electrical communication with a power supply, which can apply a bias voltage to the platen. When the platen is negatively biased, the positively charged species, or ions, from within the plasma accelerate toward the workpiece, thereby implanting the dopant species in the workpiece. At times when the plasma is on but the bias voltage to the platen is in the off state, there may be conditions conducive to dopant deposition on the wafer surface, instead of dopant implantation into the wafer.

Implants performed using PLAD systems typically utilize high concentrations of charged species in the plasma and therefore, perform relatively high dose implants. For example, the dopant concentration implanted in the workpiece using a PLAD system may be between 1E16 and 1E17 ions per square centimeter. This implant may be performed in a relatively short amount of time, such as between 30 seconds and a few minutes. This can be achieved because the concentration of ions within the plasma is typically much greater than that found in an ion beam generated in an ion beam line system.

PLAD systems are also effective for conformal doping applications. These include applications where dopant is to be implanted in all exposed surfaces of a three-dimensional structure. Examples of these structures include raised structures, such as fin type structures, and recessed structures, such as trenches. Unlike beam line systems, PLAD systems are effective at implanting ions into both the vertical surfaces and the horizontal surfaces of the workpiece.

Recently, a new set of applications, such as CMOS image sensors (CIS) shallow trench isolation (STI) and channel doping for threshold voltage control, has arisen, which require conformal doping at ion concentration levels much less than those typically associated with PLAD systems, such as 1E13.

A PLAD system, using present operating parameters, would implant this concentration of charged ions in a workpiece in a very short period of time, such as about 0.5 seconds. This period may be too short to allow adequate process control and guarantee wafer-to-wafer repeatability. Additionally, given the short duration of the implant, the species concentration in the workpiece may not be uniform.

Therefore, it would be beneficial if there were a method of achieving low dose doping and particularly, low dose, conformal doping, of a workpiece using a PLAD system.

SUMMARY

Methods of decreasing the dose per pulse (DPP) implanted into a workpiece disposed in a process chamber are disclosed. According to one embodiment, the plasma is generated by a RF power supply. This RF power supply may have two different modes, a first, referred to as continuous wave mode, where the RF power supply is continuously outputting a RF power level. This mode is typically used for creation of the plasma within the process chamber. During the second mode, referred to as pulsed plasma mode, the RF power supply outputs two different power levels. The platen bias voltage may be a more negative value when the lower RF power level is being applied. This pulsed (or multi-setpoint) plasma also assists in reducing dopant deposition on the wafer during the time when CW plasma is on but the bias voltage pulse is in the off-state.

In one embodiment, a method of performing low dose implantation of a workpiece in a process chamber is disclosed. This method comprises applying continuous wave (CW) RF power to a plasma coil and creating a plasma in the process chamber; maintaining the CW RF power applied to the plasma coil for a first predetermined period; transitioning the CW RF power to a pulsed RF power after the first predetermined period to reduce a concentration of ions in the plasma, wherein at least a first RF power level and a second lower RF power level, are repeatedly generated, causing the plasma to vary in ion concentration as a function of time; maintaining the pulsed RF power applied to the plasma coil for a second predetermined period; and implanting ions into the workpiece after the second predetermined period by applying a negative bias voltage to the workpiece while maintaining the pulsed RF power applied to the plasma coil. In a further embodiment, the bias voltage associated with the workpiece may be pulsed with a low magnitude bias voltage during the second predetermined period. In another embodiment, the bias voltage associated with the workpiece may not be pulsed until the implant begins.

In another embodiment, a method of performing low dose implantation of a workpiece in a process chamber is disclosed. The method comprises creating a plasma in the process chamber; operating a RF power supply in a pulsed plasma mode after the plasma is created to reduce a concentration of ions in the plasma, wherein, in the pulsed plasma mode, the RF power supply repeatedly generates at least a first RF power level, and a second lower RF power level, causing the plasma to vary in ion concentration as a function of time; waiting a time period; and implanting ions into the workpiece after the time period by applying a first negative bias voltage to the workpiece when the second lower RF power is generated and applying a second bias voltage, less negative than the first negative bias voltage, to the workpiece when the first RF power is generated.

In a third embodiment, a method of performing low dose implantation of a workpiece in a process chamber is disclosed. The process chamber comprises a top cover with coils disposed thereon. The method comprises creating a plasma in the process chamber by applying a RF power to the coils; waiting a first time period for conditions within the process chamber to stabilize after creating the plasma; applying, after the first time period, in an alternating manner, a first RF power to the coils and a second RF power, less than the first RF power, to the coils, causing the plasma to vary in ion concentration as a function of time; waiting a second time period for conditions within the process chamber to stabilize after the applying; and implanting ions into the workpiece after the second time period by pulsing a negative bias voltage to the workpiece, wherein a temporal relationship exists between the bias voltage pulsed to the workpiece and the RF power applied to the coils so that a more negative bias voltage is applied to the workpiece when the second RF power is applied to the coils. In a further embodiment, the top cover comprises a top horizontal surface, vertical walls and horizontal walls, where the coils are disposed on the vertical walls and the horizontal walls. The method further comprises applying RF power only to the coils disposed on the vertical walls.

BRIEF DESCRIPTION OF THE FIGURES

For a better understanding of the present disclosure, reference is made to the accompanying drawings, which are incorporated herein by reference and in which.

DETAILED DESCRIPTION

As described above, the time required for typical PLAD implants is sufficiently long so as to allow adequate process control and excellent wafer-to-wafer repeatability. In contrast, low dose implants would require less time. Therefore, in order to operate the PLAD tool in low-dose mode that meets the requisite wafer-to-wafer repeatability and process control, the time required to perform the low dose implant may need to be increased.

Figure 1:
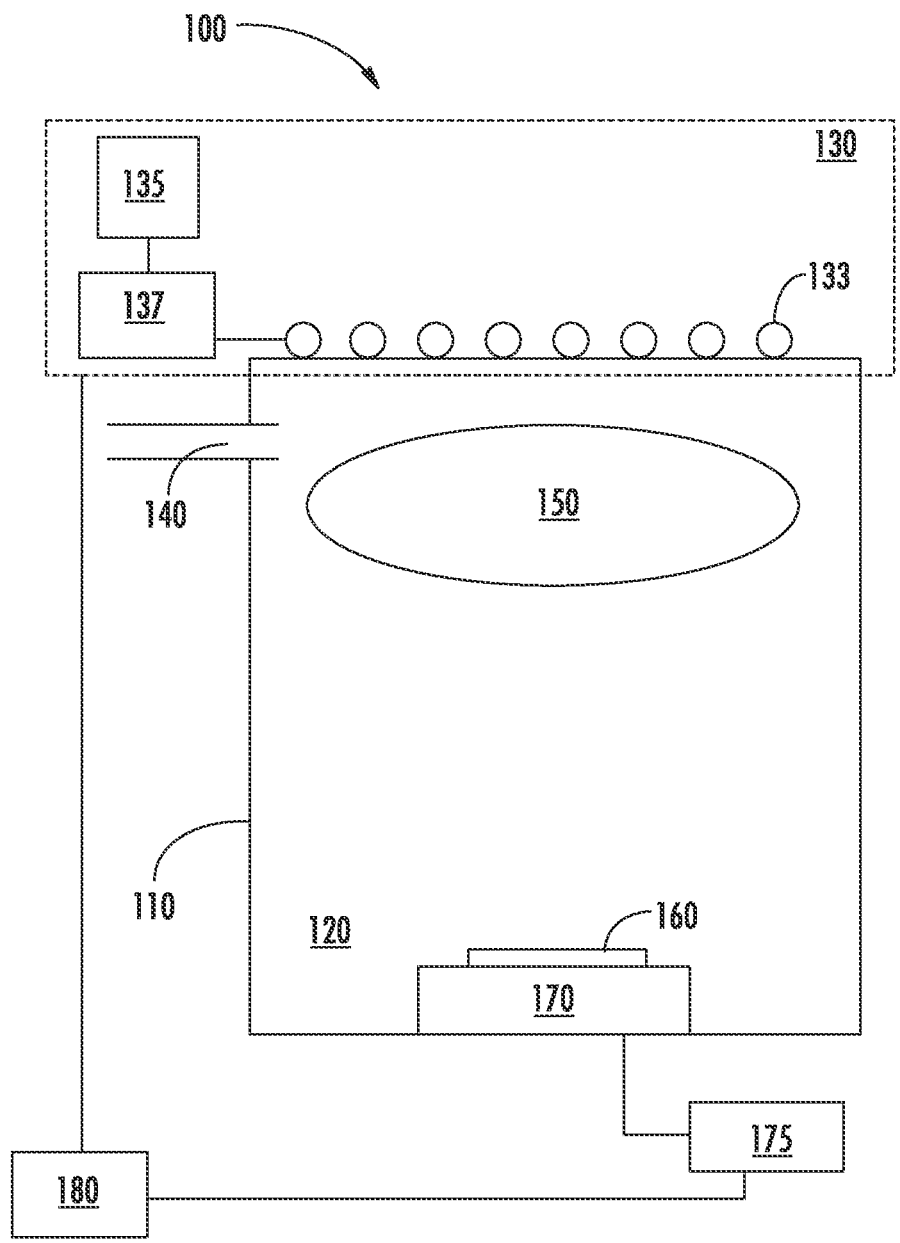
FIG. 1 shows a PLAD implant system that may be used with one embodiment.

FIG. 1 shows one embodiment of a PLAD implant system that may be used for low dose implants. The PLAD implant system 100 includes a plurality of walls 110, which define a process chamber 120. An RF energy source 130 is disposed outside the process chamber 120, preferably in close proximity to, or in contact with, one or more of the walls 110 of the process chamber 100. This RF energy source 130 may comprise one or more coils 133, which as energized by an RF power supply 135. In some embodiments, a matching circuit 137 is disposed between the RF power supply 135 and the coils 133. While FIG. 1 shows the coils arranged on the upper surface of the process chamber 100, the disclosure is not limited to this embodiment. For example, coils may be disposed on one or more vertical walls 110, if desired. In other embodiments, the upper surface of the process chamber may comprise both horizontal and vertical surfaces and the coils 133 may be disposed on any or all of these surfaces.

One or more dopant gasses enter the process chamber 120 via one or more gas inlets 140. Various types of dopant may be used. For example, in some embodiments, the dopant gasses may include $BF_3$ and argon. In other embodiments, $PH_3$ and hydrogen may be used. Other dopant gasses may also be used and the disclosure is not limited to any particular dopant gasses or mixtures thereof.

Although not shown, a vacuum pump and valves, such as pendulum or throttle valves, may be in communication with the process chamber 120 to insure that the pressure within the process chamber 120 stays within a desired range. Similarly, a pressure sensor may be included to monitor the pressure within the chamber 120, and other peripheral hardware to ensure smooth operations of the tool.

Energization of the coils 133 creates a plasma 150 within the process chamber 120. A workpiece 160 is also disposed in the process chamber 120 and is located on a platen 170. This platen 170 is in electrical communication with a bias power supply 175, which applies a bias voltage to the platen 170 as determined by controller 180.

A controller 180 may be used to control the actions within the PLAD system 100. This controller 180 may include a processing unit, in communication with a memory device. The memory device may comprise instructions, which, when executed by the processing unit, allow the controller 180 to perform the actions described herein. The controller 180 may be in communication with a variety of sensors, such as, for example, pressure sensors, temperature sensors, and voltage detectors, to monitor the activity of the PLAD system 100. In addition, the controller 180 controls the operation of the various power supplies, including, for example, the RF power supply 135 and the bias power supply 175.

In normal operation, the RF power supply 135 may provide a continuous oscillating output, such that the gas in the process chamber 120 is continuously energized. This mode of operation may be referred to as continuous wave (CW) mode. In CW mode, the RF power supply 135 may output a power of 250 W or more to power the coils 133. In one embodiment, the RF power supply 135 generates 500 W of power.

To reduce the concentration of ions in the plasma 150, the RF power supply 135 may be pulsed so as to affect the density of the plasma 150. In other words, the RF power supply 135 may have a variable output, which in turn affects the density and intensity of the plasma 150 that is generated. This second mode of operation may be referred to as pulsed or multi-setpoint plasma mode. In this pulsed mode, the RF power supply 135 generates at least two different outputs, a higher RF power level, similar to that generated during CW mode, and a lower RF power level. The duty cycle of the RF power supply 135 may vary, and may be, for example, 30% at the higher power level and 70% at the lower RF power level. However, other duty cycles are also possible and the disclosure is not limited to any particular duty cycle.

In one embodiment, a negative bias voltage is applied to the platen 170 by the bias power supply 175 when the lower RF power is applied to the coils 133 (e.g. during a first period). Because the plasma is being energized at a lower power level, this causes a smaller number of ions to be implanted during the bias voltage pulse, as compared to CW mode. Thereafter, during a second period, a more positive bias voltage, such as −100V or greater, is applied to the platen 170 by the bias power supply 175, while the higher RF power level is supplied to the coils 133. The term "more positive bias voltage" refers to any voltage; positive, negative or ground; which is greater than the first bias voltage. Thus, if the first bias voltage is, for example, −500V, the second more positive bias voltage may be any negative voltage that is more positive than −500V, such as, for example, −100V. The second more positive bias voltage may also be ground or any positive bias voltage. Stated differently, the first bias voltage is more negative than the second bias voltage. The higher RF power level serves to create more ions and electrons. In one embodiment, the implant occurs during the lower RF power and more negative bias voltage (e.g. the first period). During the application of higher RF power to the coils 133 and the more positive bias voltage to the platen 170 (e.g. the second period), a plasma with a greater concentration of ions and electrons is generated. The workpiece 160 may remain positively charged after the implant and this charge may attract electrons from the plasma, which serves to neutralize the workpiece 160. Of course, this is only one embodiment, and the relationship between the RF power levels and the bias voltages may be different than that described above. For example, the higher RF power level may overlap with the more negative bias voltage in some embodiments. In other embodiments, the higher RF power level may correspond to the assertion of the more negative bias voltage. Any desired temporal relationship between the RF power supply 135 and the bias power supply 175 may be possible. Furthermore, any combination of negative or positive bias voltages and RF power levels can be utilized. Therefore, the use of the term "pulsed plasma mode" is intended to represent any configuration where the RF power supply 135 is not driven at a constant power level, thereby causing the plasma to vary in ion concentration as a function of time. Further, in some embodiments, pulsed plasma mode may also indicate a temporal relationship between the RF power level and the bias voltage.

In one embodiment, the RF power supply 135 is transitioned to pulsed plasma mode after the first pulse of the bias power supply 175. In other words, the RF power supply 135 is maintained in continuous wave mode until it is time to implant the workpiece 160. The indication that an implant is about to start may be, for example, the bias voltage pulse created by the bias power supply 175. Once the implant begins, the RF power supply 135 may only be at the higher RF power level during the times when the bias voltage is at the more positive bias voltage. It has been found that modulating the output of the RF power supply 135 relative to the pulsed DC bias 175 may increase the implant time.

Figure 2:
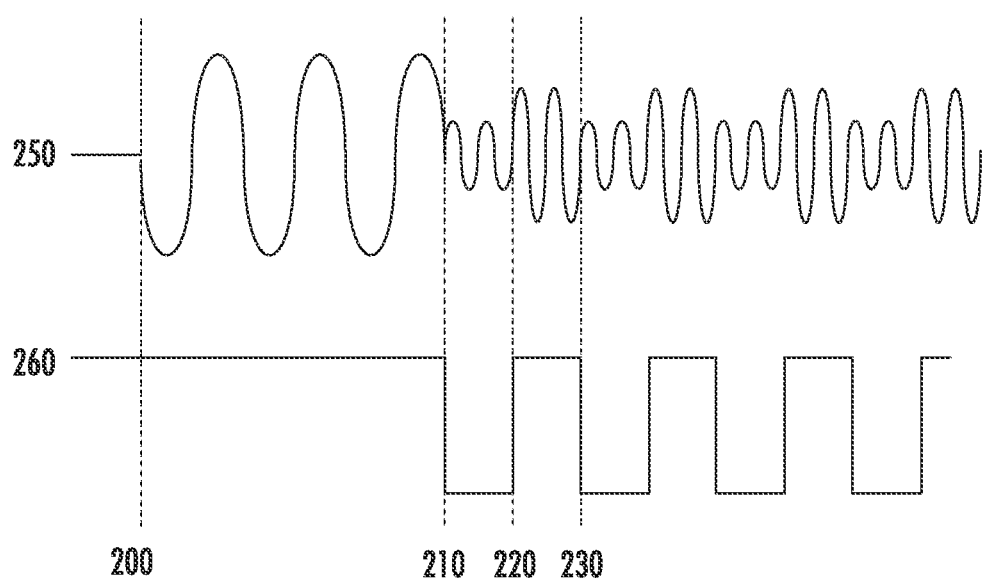
FIG. 2 is a timing diagram using pulsed plasma mode.

FIG. 2 represents a timing diagram that shows one embodiment of this process. Waveform 250 represents the output of RF power supply 135, while waveform 260 represents the bias voltage, which is the output of the bias power supply 175. First, as described above, and shown at time 200, the RF power supply 135 is turned on and is in CW mode. This results in a plasma 150 being generated in the process chamber 120. The bias voltage 260 is pulsed to a negative voltage at time 210, which causes the controller 180 to direct the RF power supply 135 to transition to pulsed plasma mode. This causes a reduction in the RF power level, as shown at time 210. The negative voltage of this bias pulse is sufficient to attract positive ions from the plasma 150 toward the workpiece 160. In some embodiments, this bias pulse may be a negative voltage in the hundreds to thousands of volts, such as but not limited to −1000V. When the pulse ends, at time 220, the controller 180 directs the RF power supply 135 to return to the first RF power level. When the next negative bias pulse occurs at time 230, the RF power supply 135 transitions back to the lower RF power level. This cycle repeats until a sufficient number of bias pulses have been generated to achieve the desired ion concentration in the workpiece 160. While FIG. 2 (as well as FIGS. 3-5) show the lower RF power level corresponding to the more negative bias voltage, other embodiments are possible. The temporal relationship between these two voltages may be varied as required by the application.

The actions described in the timing diagram shown in FIG. 2 may be coordinated by the controller 180.

Figure 3:
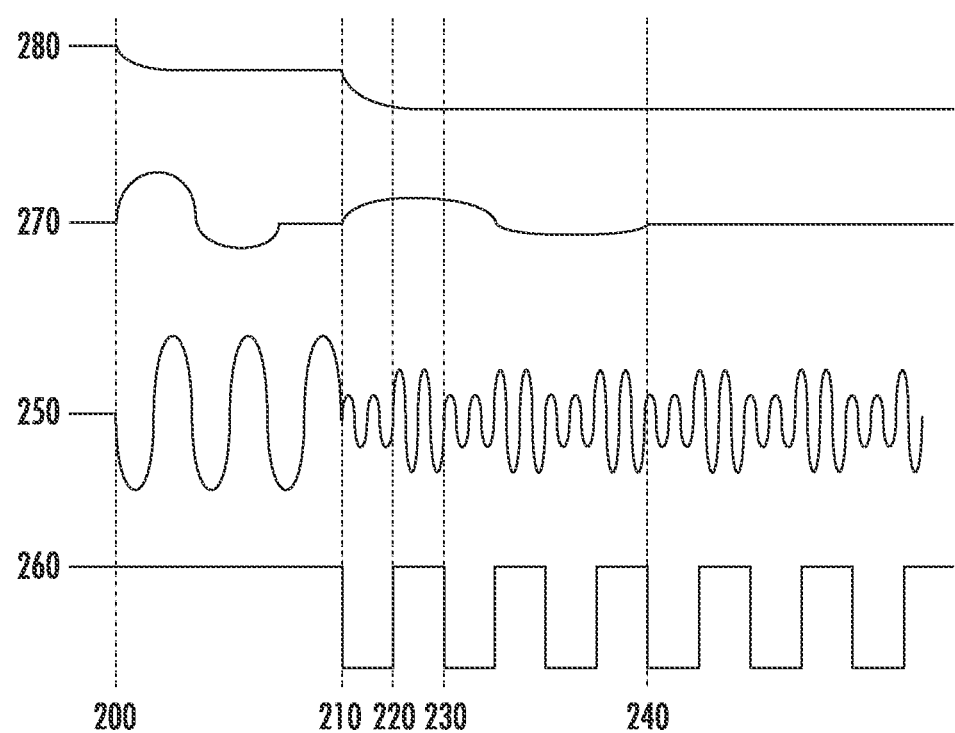
FIG. 3 is the timing diagram of FIG. 2 showing additional chamber parameters.

In some embodiments, the process of FIG. 2 may not produce the desired wafer-to-wafer repeatability. FIG. 3 shows the timing diagram as FIG. 2, but includes other parameters, such as chamber pressure 270 and the behavior of matching circuit 137. Note that at time 200, when the RF power supply 135 transitions to continuous wave mode, the pressure 270 within the process chamber 120 varies, as the PLAD system 100 adapts to the change in the internal environment. Simultaneously, the creation of the plasma causes significant fluctuation in, among other parameters, the chamber pressure, which causes the matching circuit 137 to react. Waveform 280 is used to illustrate the changes in matching circuit 137. The actual shape of the waveform 280 is not important, rather it is intended to illustrate the transient behavior of the matching circuit 137 when the RF power supply 135 changes operating modes. If the time duration between time 200 and time 210 is sufficiently long, the pressure 270 will stabilize, as will the behavior 280 of the matching circuit 137. However, the transition to pulsed plasma mode at time 210 causes another response in pressure 270 and the behavior 280 of matching circuit 137. This response may not stabilize quickly, especially for very short time low-dose applications before the pressure and matching circuit 137 have stabilized. Note that while FIG. 3 shows the pressure 270 and behavior 280 of the matching circuit 137 stabilizing after three bias pulses (i.e. by time 240), this is only illustrative. In operation, the pressure 270 and the behavior 280 of the matching circuit 137 may take much longer or shorter to stabilize. During the time prior to time 240, if any implants are performed, the desired dose per pulse (DPP) may not be implanted. Furthermore, there may be unwanted variation in the DPP for successive bias voltage pulses.

Figure 4:
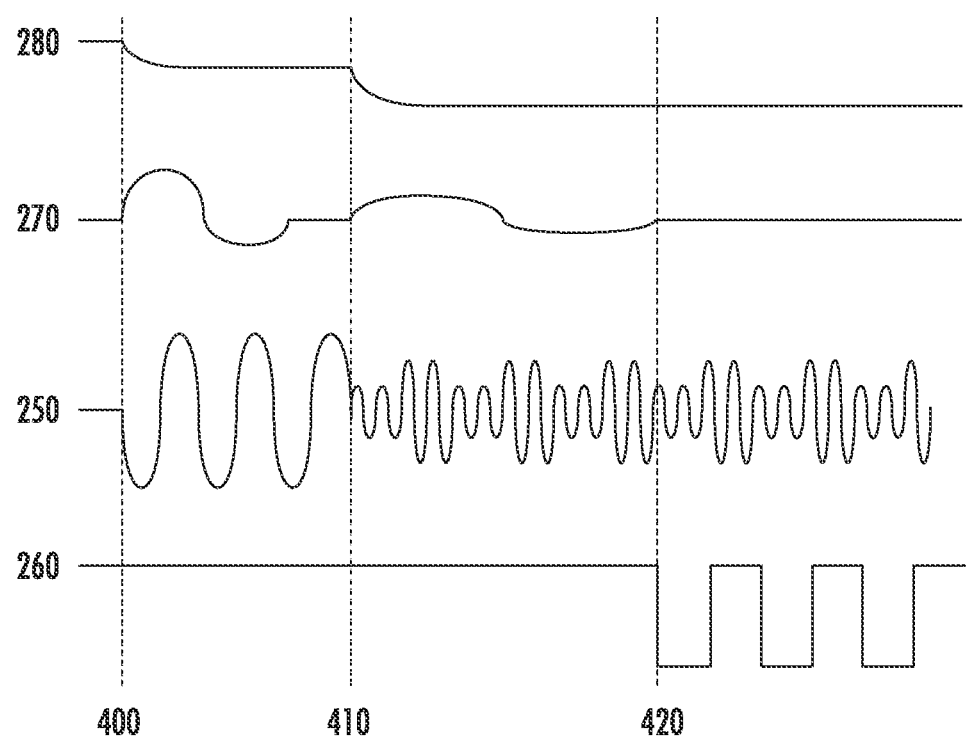
FIG. 4 is a timing diagram showing delayed implantation with pulsed plasma mode according to one embodiment.

In one embodiment, shown in FIG. 4, the initiation of pulsed plasma mode is decoupled from the bias pulses. In other words, the system starts as described before, with the RF power supply 135 entering continuous wave mode at time 400. At some later time, such as time 410, the controller 180 determines that the chamber conditions, such as pressure 270 and the behavior 280 of the matching circuit 137 are stable. At this time, or some time thereafter, the controller 180 instructs the RF power supply 135 to begin pulsed plasma mode. Note that this occurs without the pulsing of the bias voltage 260. Thus, in this case, the pulsed plasma mode refers only to the time varying nature of the RF power level. Again, the pressure 270 and behavior 280 of matching circuit 137 respond to this change. The width and frequency of the pulses generated by the RF power supply 135 during the period between time 410 and time 420 may be predetermined, such as based on expected bias voltage pulse width and frequency. In other embodiments, other values may be used. At some later time, such as time 420, the controller 180 determines that the pressure 270 and behavior 280 of the matching circuit 137 are again stable. At this time or some time thereafter, the controller 180 instructs the bias power supply 175 to begin generating pulses. It is this action that initiates the implantation process. As was described previously, the RF power supply 135 may be coordinated such that its high RF power level is active during the times when the bias voltage 260 is at the more positive bias voltage, although other embodiments are possible. By delaying the start of the implantation process until time 420, the stability of the conditions within process chamber 120 may be improved. This may result in more controllable DPP and wafer-to-wafer repeatability, especially for short time low-dose applications.

Figure 5:
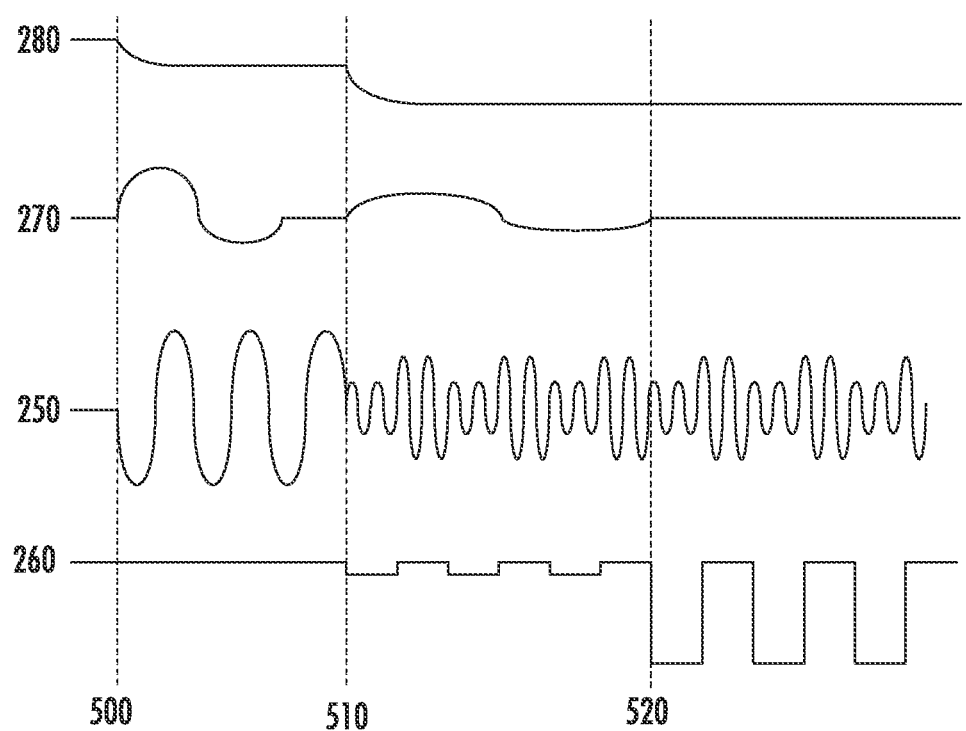
FIG. 5 is a timing diagram showing delayed implantation with pulsed plasma mode according to another embodiment.

In some embodiments, the controller 180 may be configured such that the bias pulses 260 necessarily trigger the initiation of pulsed plasma mode. In other words, the controller 180 cannot instruct the RF power supply 135 to enter pulsed plasma mode until the first bias pulse occurs. FIG. 5 shows a timing diagram of an embodiment intended to improve DPP and wafer-to-wafer repeatability in this scenario. In this embodiment, the system starts as described before, with the RF power supply 135 entering continuous wave mode at time 500. At some later time, such as time 510, the controller 180 determines that the chamber conditions, such as pressure 270 and the behavior 280 of the matching circuit 137 are stable. At this time, or some time thereafter, the controller 180 instructs the bias power supply 175 to begin creating pulses. However, unlike FIG. 3, these pulses have a much smaller magnitude, such as, for example, −1V to −100V. This first smaller magnitude voltage may be sufficient to initiate the pulsed plasma mode, as seen in FIG. 5. However, the small magnitude of the first bias voltage insures that few, if any, ions are actually implanted in the workpiece 160 during the time between time 510 and time 520. The bias power supply 175 continues pulsing the bias voltage 260 with this first low magnitude voltage, until the controller 180 determines that the conditions within the process chamber 120 are stable. At time 520, when the controller 180 makes this determination, the magnitude of the bias voltage pulse is increased, thereby allowing implantation of the workpiece 160 to take place. This second high magnitude voltage may be, for example, any negative voltage, up to −20 kV. In some embodiments, the high magnitude voltage may be, for example, between −500V and −2000V, such as −1000V. As was described previously, the RF power supply 135 may be coordinated such that the lower RF power level is supplied during the times when the bias voltage 260 is being pulsed, or may have some other relationship. Note that while FIG. 5 shows the bias voltage 260 switching directly from the first low magnitude voltage to a second high magnitude voltage, other embodiments are possible. For example, the controller 180 may cause the bias power supply 175 to transition between these two values by increasing the magnitude of successive pulse voltages until the second high magnitude bias voltage is reached. For example, the bias voltage 260 can be modulated from the low magnitude voltage in order to trigger pulsed plasma mode, to the high magnitude voltage that is used in implant, in a ramped manner with any ramp rate.

In another embodiment, the pulsed (or multi-setpoint) plasma mode may be triggered by the bias pulse at time 210 (See FIG. 2). However, the pulse width of the bias voltage 260 may be significantly different from the width of the pulsed RF power. As an example, the leading edge of the bias voltage pulse at time 210 may trigger the pulse plasma mode in the RF waveform 250, but the trailing edge of the bias pulse, at time 220, may not coincide with the end of the low RF power level. In other words, rather than using low magnitude pulses (as in FIG. 5) to trigger the pulsed plasma mode, bias pulses of short time duration are used to trigger pulsed plasma mode. These short time duration bias pulses may be sufficiently short to insure that only a small amount of ions are implanted during each short bias pulse.

Figure 6:
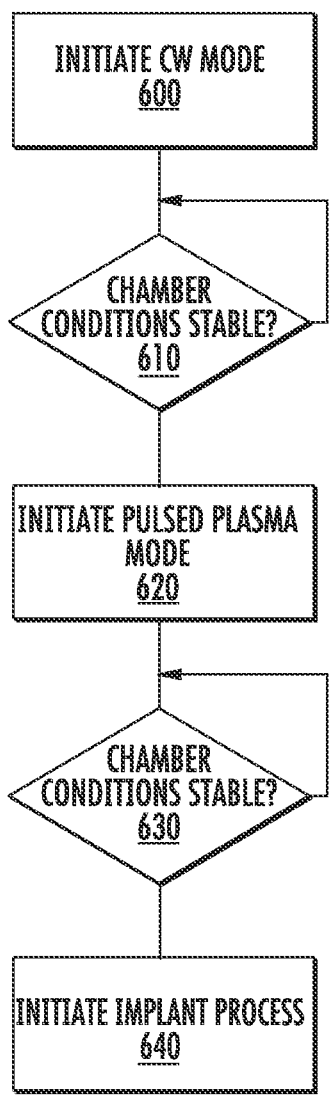
FIG. 6 illustrates a flow chart showing the delayed implant process according to one embodiment.

FIG. 6 illustrates a flowchart showing an embodiment of the delayed implant process. As seen in Box 600, the controller 180 begins operation by initiating CW mode. In this mode, the plasma 150 is created within the process chamber 120. In Box 610, the controller 180 monitors chamber conditions, waiting for them to stabilize. Once this has occurred, the controller 180 initiates pulsed plasma mode, as shown in Box 620. As described in conjunction with FIGS. 4 and 5, this can be accomplished in a number of ways. In one embodiment, the RF power supply 135 transitions to pulsed plasma mode without any activity by the bias power supply 175. In another embodiment, small magnitude bias pulses are initiated, which cause the transition to pulsed plasma mode. Even though small magnitude bias voltage pulses may be occurring in Box 620, for purposes of this disclosure, this is not considered to be an implant process. In other words, the number of ions that may be implanted during Box 620 is sufficiently small to not be considered an implant process. In another embodiment, short duration bias pulses are used to initiate pulsed plasma mode. Again, these pulses are sufficiently short so that this is not considered an implant process. The transition to pulsed plasma mode in Box 620 causes chamber conditions to respond. The controller 180 then waits until the chamber conditions are again stable, as shown in Box 630. Once the process chamber 120 is determined to be stable, the controller initiates the implant process, in Box 640. This is accomplished by generating bias voltage pulses of sufficient time duration and magnitude to allow ions to implant the workpiece 160.

Delayed implant has been shown to reduce DPP and extend the process time to ensure wafer-to-wafer repeatability. By reducing the concentration of ions in the plasma 150 through the use of pulsed plasma mode, the time required to implant a workpiece to dopant concentrations of 1E13-1E14 is increased to, for example, 8-9 seconds.

Figure 7:
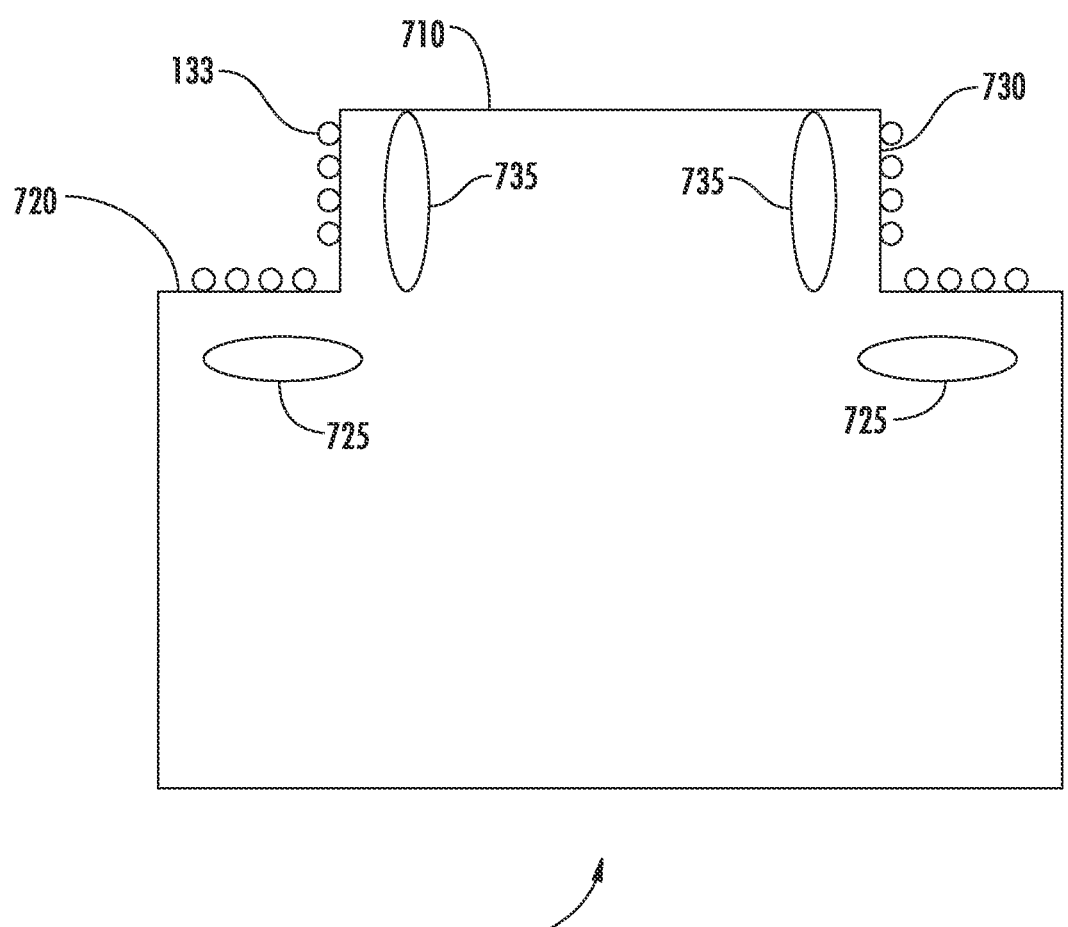
FIG. 7 shows a configuration of RF coils that may be used with any of the embodiments described herein.

Additional increases in time can be achieved using the apparatus of FIG. 7. In this embodiment, the plasma chamber 700 has a top cover that is comprised of an upper horizontal surface 710, vertical walls 730 and second horizontal walls 720. Other components associated with a plasma chamber, such as those shown in FIG. 1, may also be part of the plasma chamber 700. Coils 133 may be disposed on vertical walls 730 and second horizontal walls 720. When the coils 133 disposed on second horizontal walls 720 are energized, plasma 725 is created in the position indicated in FIG. 7. Similarly, when the coils 133 disposed on vertical walls 730 are energized, plasma 735 is created in the position indicated in FIG. 7. It has been observed that, in some embodiments, such as those which include $BF_3$ as a dopant gas, the DPP of a workpiece that is implanted using plasma 735 may be about 30% less than the DPP of a workpiece that is implanted using plasma 725. In other words, utilization of only the coils 133 disposed on the vertical walls 730 may result in a longer implant time. The use of these coils 133, in combination with delayed implant, as described above, may sufficiently increase implant time for low dose applications, allowing improved DPP and wafer-to-wafer repeatability.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting a workpiece disposed in a process chamber, comprising:
    applying continuous wave (CW) RF power to a plasma coil and creating a plasma in said process chamber;
    maintaining the CW RF power applied to the plasma coil for a first predetermined period;
    transitioning said CW RF power to a pulsed RF power after said first predetermined period to reduce a concentration of ions in said plasma, wherein at least a first RF power level and a second lower RF power level are repeatedly generated, causing said plasma to vary in ion concentration as a function of time, wherein said transitioning to said pulsed RF power occurs after a first bias voltage pulse is applied to said workpiece, and wherein substantially no ions are implanted into said workpiece as a result of the first bias voltage pulse being applied to said workpiece;
    maintaining the pulsed RF power applied to the plasma coil for a second predetermined period; and
    initiating implanting ions from said plasma into said workpiece after said second predetermined period by applying a negative bias voltage to said workpiece while maintaining the pulsed RF power applied to the plasma coil.

2. The method of claim 1, wherein two different bias voltages are alternatingly applied to said workpiece after said second predetermined period, wherein a more negative bias voltage is applied to said workpiece when said second lower RF power level is generated.

3. The method of claim 2, wherein a more positive bias voltage is applied to said workpiece when said first RF power level is generated.

4. The method of claim 1, wherein a voltage of said first bias voltage pulse is less negative than said negative bias voltage.

5. The method of claim 4, wherein bias pulses are applied to said workpiece during said second predetermined period, wherein voltages of said bias pulses are less negative than said negative bias voltage.

6. The method of claim 5, wherein voltages of said bias pulses during said second predetermined period are equal.

7. The method of claim 5, wherein voltages of said bias pulses during said second predetermined period become more negative over time.

8. The method of claim 1, wherein said negative bias voltage is applied for a first time duration and wherein said first bias voltage pulse is of a shorter time duration than said first time duration.

9. The method of claim 1, wherein said first predetermined period and said second predetermined period comprise times needed for conditions to stabilize in said process chamber after a change in RF power.

10. The method of claim 9, wherein said conditions comprise chamber pressure and matching circuit behavior.

11. A method of implanting a workpiece disposed in a process chamber, comprising:
    creating a plasma in said process chamber by applying a continuous wave (CW) RF power to a plasma coil;
    switching from the CW RF power to a RF power supply in a pulsed plasma mode after said plasma is created and after conditions stabilize in said process chamber to reduce a concentration of ions in said plasma, wherein, in said pulsed plasma mode, said RF power supply repeatedly generates at least a first RF power level and a second lower RF power level, causing said plasma to vary in ion concentration as a function of time;
    applying a first bias voltage pulse to said workpiece after said plasma is created, wherein application of said first bias voltage pulse causes a controller to direct said RF power supply to operate in said pulsed plasma mode, and wherein substantially no ions are implanted into said workpiece as a result of the first bias voltage pulse being applied to said workpiece;
    waiting a time period; and
    initiating implanting ions from said plasma into said workpiece after said time period by applying a first negative bias voltage to said workpiece when said second lower RF power level is generated and applying a second bias voltage, less negative than said first negative bias voltage, to said workpiece when said first RF power level is generated.

12. The method of claim 11, wherein a voltage of said first bias voltage pulse is less negative than said first negative bias voltage.

13. A method of implanting a workpiece disposed in a process chamber, wherein said process chamber comprises a top cover with coils disposed thereon, comprising:
    creating a plasma in said process chamber by applying a continuous wave RF power to said coils;
    waiting a first time period for conditions within said process chamber to stabilize after creating said plasma;
    switching from the continuous wave RF power, after said first time period, to a pulsed RF power whereby a first RF power and a second RF power of the pulsed RF power are applied to said coils in an alternating manner, the second RF power being less than said first RF power, wherein said application of the first RF power and the second RF power to said coils is initiated, by a controller, by applying a first bias voltage pulse to said workpiece, and wherein substantially no ions are implanted into said workpiece as a result of the first bias voltage pulse being applied to said workpiece;
    waiting a second time period for conditions within said process chamber to stabilize after said applying; and
    initiating implanting ions from said plasma into said workpiece after said second time period by pulsing a negative bias voltage to said workpiece, wherein a temporal relationship exists between said negative bias voltage pulsed to said workpiece and said RF power applied to said coils so that a more negative bias voltage is applied to said workpiece when said second RF power is applied to said coils.

14. The method of claim 13, wherein said top cover comprises an upper horizontal surface, vertical walls and horizontal walls, wherein coils are disposed on said vertical walls and said horizontal walls, wherein said applying further comprises applying RF power only to coils disposed on said vertical walls.

15. The method of claim 14, wherein a voltage of said first bias voltage pulse is less negative than said negative bias voltage.

16. The method of claim 13, wherein a duration of said first bias voltage pulse is less than a duration of said negative bias voltage pulsed to said workpiece.

* * * * *